(12) United States Patent
Mu et al.

(10) Patent No.: US 11,005,180 B2
(45) Date of Patent: May 11, 2021

(54) DISPLAY DEVICE HAVING NFC COMMUNICATION FUNCTION

(71) Applicant: SUZHOU QINGYUE OPTOELECTRONICS TECHNOLOGY CO., LTD., Kunshan (CN)

(72) Inventors: Xinju Mu, Kunshan (CN); Pengyun Li, Kunshan (CN); Fengjuan Lu, Kunshan (CN)

(73) Assignee: SUZHOU QINGYUE OPTOELECTRONICS TECHNOLOGY CO., LTD., Kunshan (CN)

( * ) Notice: Subject to any disclaimer, the term of this patent is extended or adjusted under 35 U.S.C. 154(b) by 210 days.

(21) Appl. No.: 16/060,954

(22) PCT Filed: Feb. 24, 2017

(86) PCT No.: PCT/CN2017/074789
§ 371 (c)(1),
(2) Date: Jun. 10, 2018

(87) PCT Pub. No.: WO2017/152780
PCT Pub. Date: Sep. 14, 2017

(65) Prior Publication Data
US 2020/0266542 A1    Aug. 20, 2020

(30) Foreign Application Priority Data

Mar. 10, 2016 (CN) .......................... 201610136085.5
Mar. 10, 2016 (CN) .......................... 201610136365.6

(51) Int. Cl.
*H01Q 7/00* (2006.01)
*G06F 3/041* (2006.01)
(Continued)

(52) U.S. Cl.
CPC ............... *H01Q 7/00* (2013.01); *G06F 3/041* (2013.01); *H01L 27/323* (2013.01);
(Continued)

(58) Field of Classification Search
CPC ........ H01Q 1/2283; H01Q 7/00; G06F 3/041; G06F 2203/04103; H01L 27/323; H01L 27/3272
See application file for complete search history.

(56) References Cited

U.S. PATENT DOCUMENTS

| | | | | |
|---|---|---|---|---|
| 2013/0162594 A1* | 6/2013 | Paulsen | ..................... | H01Q 1/48 345/174 |
| 2013/0229362 A1* | 9/2013 | Liu | .......................... | H01Q 1/44 345/173 |

(Continued)

FOREIGN PATENT DOCUMENTS

| | | |
|---|---|---|
| CN | 101105839 A | 1/2008 |
| CN | 101853104 A | 10/2010 |

(Continued)

*Primary Examiner* — Ricardo I Magallanes
(74) *Attorney, Agent, or Firm* — Cheng-Ju Chiang

(57) ABSTRACT

A display device having an NFC communication function includes a display panel, wherein an NFC antenna is integrated in the display device, the NFC antenna is disposed on a display surface side of the display panel, and the NFC antenna is made of a transparent conductive material. The NFC antenna is integrated in the display device, the NFC antenna is disposed on a display surface side of the display panel, therefore the sensitivity and reliability of the NFC signals are high, the NFC antenna is not easy to be broken and misaligned, and as the NFC antenna is made of a transparent conductive material, it can be placed in the display area, which is conducive to the design of a narrow frame for a module.

18 Claims, 10 Drawing Sheets

(51) Int. Cl.
  *H01L 27/32* (2006.01)
  *H01Q 1/24* (2006.01)
  *H01Q 1/36* (2006.01)
  *H01L 51/52* (2006.01)

(52) U.S. Cl.
  CPC ...... *H01L 27/3225* (2013.01); *H01L 27/3272* (2013.01); *H01L 51/524* (2013.01); *H01Q 1/243* (2013.01); *H01Q 1/368* (2013.01); *G06F 2203/04107* (2013.01); *H04M 2201/38* (2013.01)

(56) References Cited

U.S. PATENT DOCUMENTS

| | | | |
|---|---|---|---|
| 2015/0022081 A1* | 1/2015 | Li | H01Q 1/2258 315/34 |
| 2015/0138030 A1* | 5/2015 | Yosui | H01Q 7/06 343/787 |
| 2017/0179567 A1 | 6/2017 | Zou et al. | |

FOREIGN PATENT DOCUMENTS

| | | |
|---|---|---|
| CN | 102569987 A | 7/2012 |
| CN | 102737582 A | 10/2012 |
| CN | 102751309 A | 10/2012 |
| CN | 102799307 A | 11/2012 |
| CN | 103294247 A | 9/2013 |
| CN | 103887073 A | 6/2014 |
| CN | 104137335 A | 11/2014 |
| CN | 104252272 A | 12/2014 |
| CN | 104991365 A | 10/2015 |
| CN | 105006652 A | 10/2015 |
| CN | 105094231 A | 11/2015 |
| CN | 204790936 U | 11/2015 |
| CN | 105359066 A | 2/2016 |
| CN | 105824359 A | 8/2016 |
| CN | 105824460 A | 8/2016 |
| EP | 2830152 A1 | 1/2015 |
| JP | 2014-127201 A | 7/2014 |
| KR | 10-2013-0070247 A | 6/2013 |
| TW | 201434204 A | 9/2014 |
| TW | 201444175 A | 11/2014 |
| WO | 2015/044617 A2 | 4/2015 |
| WO | 2015/044617 A3 | 4/2015 |

* cited by examiner

DISPLAY DEVICE HAVING NFC COMMUNICATION FUNCTION

CROSS REFERENCE TO RELATED APPLICATIONS

This application is a 35 U.S.C. § 371 National Phase conversion of International (PCT) Patent Application No. PCT/CN2017/074789, filed on Feb. 24, 2017, which claims the priority of Chinese patent application No. 201610136085.5 and the priority of Chinese patent application No. 201610136365.6, both of which are filed on the same day of Mar. 10, 2016. The contents of the above-identified applications are incorporated herein by reference. The PCT International Patent Application was filed and published in Chinese.

TECHNICAL FIELD

The present disclosure relates to display technology, and more particularly to a display device having an NFC communication function.

BACKGROUND

There are various display technologies, including liquid crystal display (LCD) and organic light-emitting diode (OLED) display. The OLED display is very attractive, which has the advantages of self light-emitting, lightness, thinness, power saving, and can be made into a flexible display based on flexible materials, so that it can be curled, folded, or as a part of a wearable device. The light-emitting principle of the OLED is to deposit a very thin organic light-emitting material between two electrodes, and light-emitting is caused due to the injection and coupling of carrier when the organic light-emitting material is energized with electric current.

Graphene is the thinnest and hardest nanomaterial as currently known in the world. It is almost completely transparent and absorbs only 2.3% of light, and the resistivity of graphene is extremely low, which is only $10^{-8}$ $\Omega \cdot m$. Therefore, it is a transparent conductor with excellent prospects. It is suitable for making transparent touch screens, light boards, and even solar cells. Further, relevant researches show that the layered nanostructure of graphene has the characteristics of electromagnetic wave absorption and is a new type of material for absorbing wave.

Silver nanowire technology is to coat silver nanowire ink material on a plastic or glass substrate, and then use laser photolithography to produce a transparent conductive film with conductive mesh pattern of nanoscale silver wire. In addition to the excellent conductivity of silver, silver nanowire has excellent light transmittance and flexure resistance due to the nanometer size effect, so it is regarded as the most likely substitute for traditional ITO transparent electrode. Further, the silver nanowire thin film has a small bending radius, and a small resistance change rate when it is bent. It is more advantageous when it is applied to the equipment with surface display, such as smart watch, hand ring.

Near field communication (NFC) is a short-range wireless communication technology, which allows non-contact point to point data transmission between electronic devices (in the range of ten centimeters). This technology evolves from the non-contact radio frequency identification (RFID) and is downward compatible with RFID, and is mainly used to provide M2M (machine to machine) communication in handset devices, e.g., mobile phone. As near field communication has natural security, NFC technology is considered to have great application prospects in mobile payment and other fields.

Currently, except for commonly used mobile phones, more and more electronic devices, especially wearable products, begin to integrate with NFC function. However, due to the restriction of the outer profile of the wearable products and other small-sized electronic devices, the requirements for the size and integration of electronic components are relatively high. At present, a usual manner of integrating the NFC antenna into an inside of the product is that the NFC antenna is formed on a PCB board or an FPC soft board and made into a coil by metal wire, and then the PCB board or the FPC soft board with the coil is attached to a battery or a shell. The shortcomings of which are:

(1) NFC antenna occupies a large space inside the device, and cannot meet the design requirement of small-sized electronic devices.

(2) Conventional NFC antenna is a coil structure made of metal wire on PCB board or FPC soft board, and then the PCB board or the FPC soft board with the coil is attached to a battery or a shell. However, repeated assembly and disassembly of the battery and the shell will cause wear out or misalignment for the NFC antenna, thereby affecting the transmission of NFC signals.

(3) Due to the close distance of NFC communication, some electronic devices, such as the wrist watch, put forward the demand for the NFC antenna to be disposed on the display surface, in order to ensure the intensity and stability of NFC signals.

An existing solution of integrating the NFC antenna into the front of display screen is that the NFC antenna is made of conductors such as silver, copper, the coil of the NFC antenna must be put outside the display area, and a middle area thereof is made into being hollow to avoid the NFC antenna blocking the display area. However, in such solution, in order to ensure the space for the NFC antenna, the frame for the NFC antenna will be very large, thereby increasing the size of the frame of the whole module around the display area. This solution solves the problem of easy wear out and misalignment of the conventional NFC antenna to some extent, but the too large size of the module frame is also not conducive to the design of small-sized electronic devices.

SUMMARY

In order to overcome the above problems, the present disclosure is intended to provide a display device having an NFC communication function. By integrating an NFC antenna into the display device and using a transparent conductive material to form the NFC antenna, the sensitivity and reliability of the NFC signals are high, the NFC antenna is not easy to be broken and misaligned, the NFC antenna can be placed in the display area, and a design of narrow frame for the module can be realized.

In an embodiment, the present disclosure provides a display device having an NFC communication function, comprising a display panel. An NFC antenna is integrated in the display device, the NFC antenna is disposed on a display surface side of the display panel, and the NFC antenna is made of a transparent conductive material.

Further, the NFC antenna is made of ITO, graphene, or silver nanowire.

Further, a first transparent thin film and a second transparent thin film are provided on the display panel. The NFC antenna includes a first antenna and a second antenna. The first antenna is formed on a surface of the first transparent thin film. The second antenna is formed on a surface of the second transparent thin film. The first transparent thin film and the second transparent thin film are oppositely affixed together by the two surfaces having the antennas.

Further, the first antenna includes a first engaging pad, a second engaging pad, and a wiring connected between the first engaging pad and the second engaging pad. The second antenna includes a third engaging pad, a fourth engaging pad, and a lead connected between the third engaging pad and the fourth engaging pad. The second engaging pad and the fourth engaging pad are correspondingly affixed and electrically connected. The first engaging pad and the third engaging pad are mutually staggered and used for connecting to an external circuit.

Further, a transparent thin film is provided on the display panel. The transparent thin film has a first surface and a second surface being opposite to the first surface. The NFC antenna includes a first antenna and a second antenna. The first antenna is formed on the first surface of the transparent thin film, and the second antenna is formed on the second surface of the transparent thin film.

Further, the first antenna includes a first engaging pad, a second engaging pad, a third engaging pad, and a wiring connected between the first engaging pad and the second engaging pad. The second antenna includes a fourth engaging pad, a fifth engaging pad, and a lead connected between the fourth engaging pad and the fifth engaging pad. The transparent thin film is defined with a first through hole and a second through hole. A position of the second engaging pad corresponds to a position of the fourth engaging pad, and the second engaging pad and the fourth engaging pad are electrically connected via the first through hole. A position of the third engaging pad corresponds to a position of the fifth engaging pad, and the third engaging pad and the fifth engaging pad are electrically connected via the second through hole. The first engaging pad and the third engaging pad are mutually staggered and used for connecting to an external circuit.

Further, a transparent thin film is provided on the display panel. The transparent thin film has a first surface and a second surface being opposite to the first surface. The NFC antenna is formed on the first surface of the transparent thin film.

Further, the NFC antenna includes a first engaging pad, a second engaging pad, a third engaging pad, a wiring connected between the first engaging pad and the second engaging pad, and a transparent insulated wire. The second engaging pad is electrically connected to the third engaging pad via the transparent insulated wire. The first engaging pad and the third engaging pad are mutually staggered and used for connecting to an external circuit.

Further, a transparent thin film and a cover glass are provided on the display panel. The cover glass covers on the transparent thin film. The NFC antenna includes a first antenna and a second antenna. The first antenna is formed on a surface of the transparent thin film, and the second antenna is formed on a surface of the cover glass. The transparent thin film and the cover glass are oppositely affixed together by the two surfaces having the antennas.

Further, the first antenna includes a first engaging pad, a second engaging pad, and a wiring connected between the first engaging pad and the second engaging pad. The second antenna includes a third engaging pad, a fourth engaging pad, and a lead connected between the third engaging pad and the fourth engaging pad. The second engaging pad and the fourth engaging pad are correspondingly affixed and electrically connected. The first engaging pad and the third engaging pad are mutually staggered and used for connecting to an external circuit.

Further, an isolating layer is provided between the display panel and the NFC antenna.

Further, a touch sensing layer is provided between the display panel and the NFC antenna.

Further, a shielding layer is provided between the display panel and the touch sensing layer.

Further, an isolating layer is provided between the touch sensing layer and the NFC antenna.

Further, the display panel is an OLED display panel and includes an OLED package cover, an OLED first electrode, an OLED emitting zone, an OLED second electrode and an OLED substrate which are provided to laminate in this order. The OLED emitting zone emits light towards the OLED substrate for display. The NFC antenna is disposed on a side of the OLED substrate that is far away from the OLED emitting zone.

Further, the OLED substrate has a first surface facing towards the OLED emitting zone and a second surface being far away from the OLED emitting zone. The NFC antenna is formed on the second surface of the OLED substrate.

Further, the NFC antenna is directly formed on the second surface of the OLED substrate.

Further, a transparent wave absorption layer is provided between the NFC antenna and the second surface of the OLED substrate. The transparent wave absorption layer is firstly provided on the second surface of the OLED substrate. The NFC antenna is thereafter provided on the transparent wave absorption layer.

Further, the NFC antenna includes a first engaging pad, a second engaging pad, and a wiring connected between the first engaging pad and the second engaging pad.

Further, the NFC antenna includes a first engaging pad, a second engaging pad, a third engaging pad, a wiring connected between the first engaging pad and the second engaging pad, and a transparent insulated wire. The second engaging pad is connected to the third engaging pad via the transparent insulated wire. The first engaging pad and the third engaging pad are mutually staggered and used for connecting to an external circuit.

In the display devices having an NFC communication function according to the embodiments of the present disclosure, by integrating the NFC antenna in the display device may reduce the number of components, reduce the thickness of the module, simplify the producing process and lower the production cost. Further, by disposing the NFC antenna on the display surface side of the display panel, the communication distance of NFC signals is shortened, and the sensitivity and reliability of the NFC signals are higher. At the same time, the conventional problem, that the NFC antenna is easily broken and misaligned which is caused by the assembly and disassembly of the battery and the housing, is solved, by using a transparent, low resistance material, such as ITO, graphene, or silver nanowire as the conductor of the NFC antenna, so that the NFC antenna can be put in the display area, it is conductive to a design of narrow frame for the module, to meet the design requirements of narrow frame for mobile phones, watches or other portable electronic devices. Therefore, it has a good market prospect in the application field of small-sized electronic devices, such as wearable devices.

DETAILED DESCRIPTION OF PREFERRED EMBODIMENTS

Figure 1:
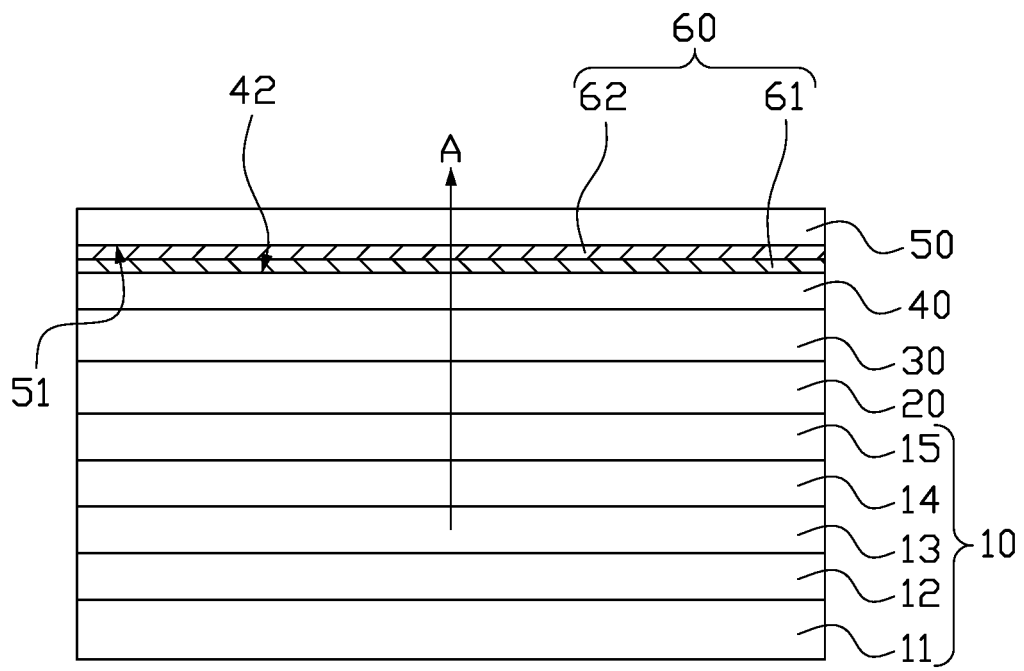
FIG. 1 is a structure schematic view of a display device according to a first embodiment of the present disclosure.

In order to make the purposes, technical solutions and advantages of the present disclosure more clearly, embodiments of the present disclosure will be further described with reference to the drawing figures below.

First Embodiment

FIG. 1 is a structure schematic view of a display device according to a first embodiment of the present disclosure. Referring to FIG. 1, the display device includes a display panel 10, a shielding layer 20, a touch sensing layer 30, a first transparent thin film 40 and a second transparent thin film 50. In the present embodiment, the display panel 10, the shielding layer 20, the touch sensing layer 30, the first transparent thin film 40 and the second transparent thin film 50 are sequentially laminated. That is, the shielding layer 20 is disposed on the display panel 10, the touch sensing layer 30 is disposed on the shielding layer 20, the first transparent thin film 40 is disposed on the touch sensing layer 30, and the second transparent thin film 50 is disposed on the first transparent thin film 40. Each structural layer may be affixed to each other by optical clear adhesive (OCA). In other embodiments, the positions of the first transparent thin film 40 and the second transparent thin film 50 can be interchanged, i.e., the first transparent thin film 40 may be disposed on the second transparent thin film 50.

The display panel 10 may be, for example, an OLED display panel, an E-ink display panel, or an LCD display panel. In the present embodiment, the display panel 10 is an OLED display panel and includes an OLED package cover 11, an OLED first electrode 12, an OLED emitting zone 13, an OLED second electrode 14 and an OLED substrate 15 which are provided to laminate in this order. The OLED package cover 11 is used for package, which usually consists of a package cover and desiccant or a package film and desiccant, to prevent water and oxygen from entering into the OLED emitting zone 13. The OLED first electrode 12 is usually a metal (such as aluminum, silver or magnesium) electrode. The OLED emitting zone 13 includes, for example, an electron injection layer, an electron transport layer, an emitting layer, a hole injection layer, and a hole transport layer. The OLED second electrode 14 is usually made of a transparent conductive material, such as ITO. The OLED substrate 15 includes OLED pixels and leads for connecting to a driver IC. The OLED substrate 15 is usually made of a transparent material, such as glass or flexible thin film. The OLED second electrode 14 may be formed on the lower surface of the OLED substrate 15 by etching or printing. When the OLED display panel is displaying an image, the OLED emitting zone 13 emits light towards the OLED substrate 15 side for display (as indicated by arrow A). That is, the first transparent thin film 40 and the second transparent thin film 50 are disposed on the display surface side of the display panel 10.

An NFC antenna 60 is integrated in the display device, and the NFC antenna 60 is disposed at the display surface side of the display panel 10. The NFC antenna 60 is made of a transparent conductive material, such as ITO, graphene, or silver nanowire. In the present embodiment, the NFC antenna 60 is formed between the first transparent thin film 40 and the second transparent thin film 50, so that the NFC antenna 60 is disposed on a side of the OLED substrate 15 that is far away from the OLED emitting zone 13. As the OLED emitting zone 13 emits light towards the OLED substrate 15 side for display, the NFC antenna 60 is located on a side of the display panel 10 being close to the display surface side.

Figure 2:
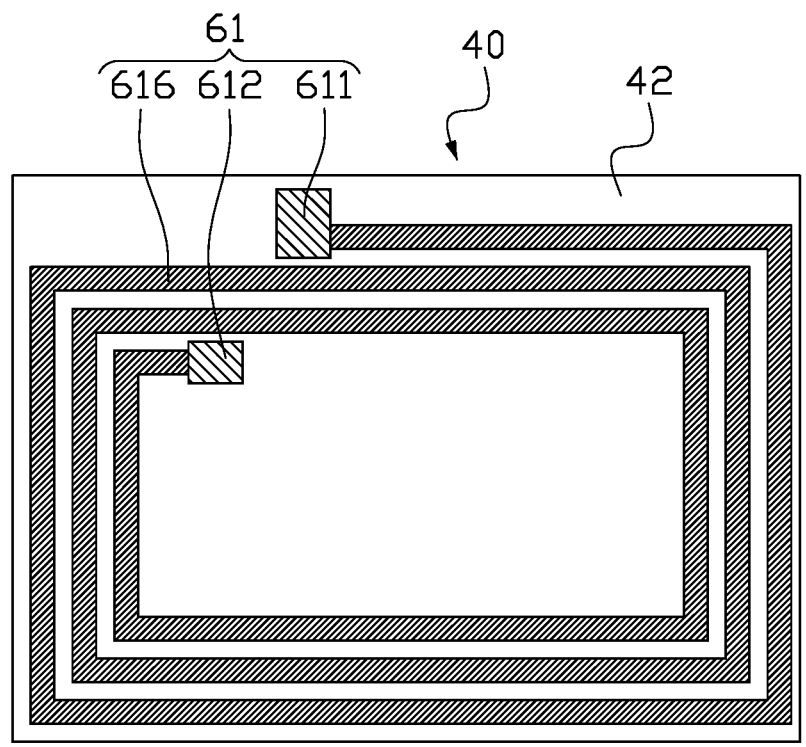
FIG. 2 is a plan schematic view of the first transparent thin film of FIG. 1.
Figure 3:
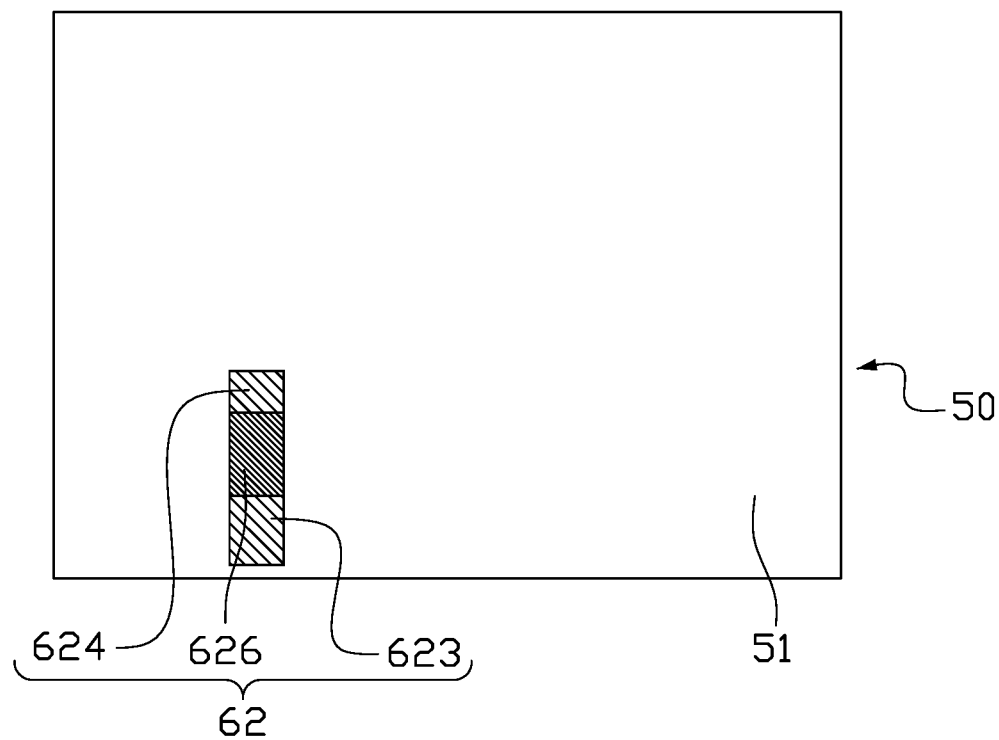
FIG. 3 is a plan schematic view of the second transparent thin film of FIG. 1.

FIG. 2 is a plan schematic view of the first transparent thin film of FIG. 1. FIG. 3 is a plan schematic view of the second transparent thin film of FIG. 1. Referring to FIGS. 2-3, in the present embodiment, the NFC antenna 60 includes a first antenna 61 and a second antenna 62. The first antenna 61 is formed on a surface 42 of the first transparent thin film 40 (the upper surface of the first transparent thin film 40 in the present embodiment). The second antenna 62 is formed on a surface 51 of the second transparent thin film 50 (the lower surface of the second transparent thin film 50 in the present embodiment). The first transparent thin film 40 and the second transparent thin film 50 are oppositely affixed together by the two surfaces 42, 51 having the antennas. The first antenna 61 and the second antenna 62 are made of conductive materials having high transmittance and low resistance, such as ITO, graphene, or silver nanowire.

More specifically, the first antenna 61 is formed on the surface 42 of the first transparent thin film 40. The first antenna 61 includes a first engaging pad 611, a second engaging pad 612, and a wiring 616 connected between the first engaging pad 611 and the second engaging pad 612, wherein the first engaging pad 611 is located at the edge of the first transparent thin film 40. The second antenna 62 is formed on the surface 51 of the second transparent thin film 50. The second antenna 62 includes a third engaging pad 623, a fourth engaging pad 624, and a lead 626 connected between the third engaging pad 623 and the fourth engaging pad 624, wherein the third engaging pad 623 is located at the edge of the second transparent thin film 50. The third engaging pad 623 and the first engaging pad 611 are misaligned from each other. The fourth engaging pad 624 and the second engaging pad 612 are aligned with each other. When the first transparent thin film 40 and the second transparent thin film 50 are oppositely affixed together, the second engaging pad 612 and the fourth engaging pad 624 are correspondingly contacted and electrically connected. The first engaging pad 611 and the third engaging pad 623 are mutually staggered and used for connecting to an external circuit.

When the first transparent thin film 40 and the second transparent thin film 50 are affixed together via an optical clear adhesive, the positions at which the first engaging pad 611, the second engaging pad 612, the third engaging pad 623 and the fourth engaging pad 624 are located are not applied with the optical clear adhesive, while other positions (including the positions at which the wiring 616 of the first antenna 61 and the lead 626 of the second antenna 62 are located) are applied with the optical clear adhesive. When the first transparent thin film 40 and the second transparent thin film 50 are affixed via the optical clear adhesive, because the optical clear adhesive is an insulator, the wiring 616 of the first antenna 61 and the lead 626 of the second antenna 62 are insulated from each other, the first antenna 61 and the second antenna 62 are electrically connected to form the NFC antenna 60 through the contact between the second engaging pad 612 and the fourth engaging pad 624. The NFC antenna 60 is then connected to the external circuit after the first engaging pad 611 and the third engaging pad 623 are bonded with an FPC or led out in other ways.

The touch sensing layer 30 is provided between the display panel 10 and the NFC antenna 60. The touch sensing layer 30 causes the display device having touch function. In the present embodiment, the pattern of the touch sensing layer 30 is made of a conductor of graphene or silver nanowire, preferably, graphene. Because the magnetic field of the NFC antenna 60 is easily disturbed by metals, if the pattern of the touch sensing layer 30 is made of graphene, the wave absorption property of graphene can ensure the intensity of NFC signals better, thus not disturbing to the NFC signals.

The shielding layer 20 is provided between the display panel 10 and the touch sensing layer 30. The shielding layer 20 is a thin film coated with ITO, graphene, or silver nanowire, mainly used for shielding display signals of the display panel 10 from disturbing to the touch sensing layer 30 disposed above the display panel 10. The shielding layer 20 can be reserved or removed according to actual situations.

Second Embodiment

Figure 4:
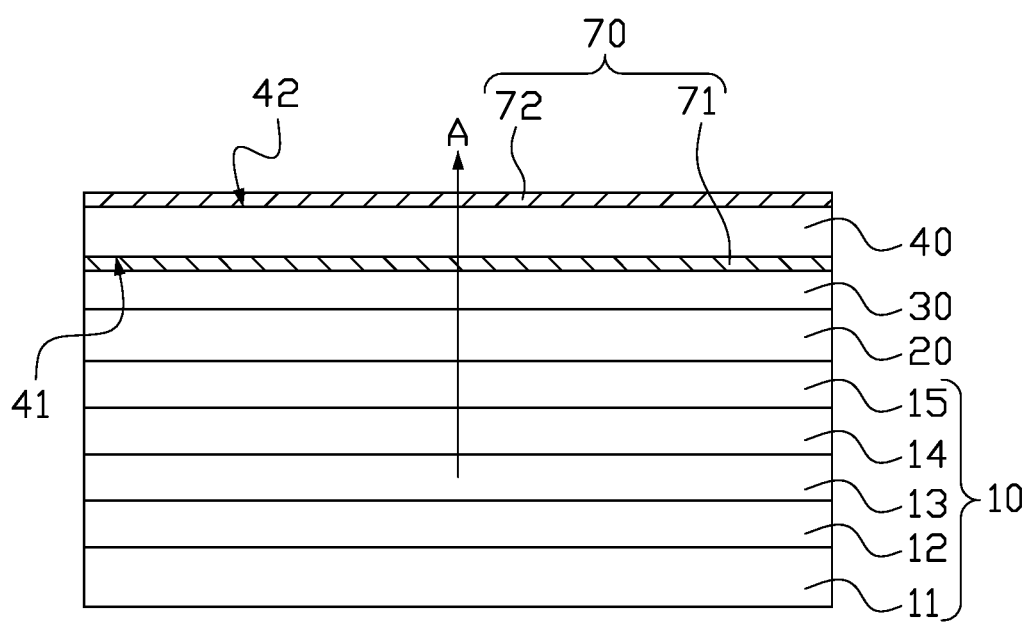
FIG. 4 is a structure schematic view of a display device according to a second embodiment of the present disclosure.

FIG. 4 is a structure schematic view of a display device according to a second embodiment of the present disclosure. Referring to FIG. 4, the display device includes a display panel 10, a shielding layer 20, a touch sensing layer 30 and a transparent thin film 40. In the present embodiment, the display panel 10, the shielding layer 20, the touch sensing layer 30 and the transparent thin film 40 are sequentially laminated. That is, the shielding layer 20 is disposed on the display panel 10, the touch sensing layer 30 is disposed on the shielding layer 20, and the transparent thin film 40 is disposed on the touch sensing layer 30. Each structural layer may be affixed to each other by optical clear adhesive (OCA).

The display panel 10 may be, for example, an OLED display panel, an E-ink display panel, or an LCD display panel. In the present embodiment, the display panel 10 is an OLED display panel and includes an OLED package cover 11, an OLED first electrode 12, an OLED emitting zone 13, an OLED second electrode 14 and an OLED substrate 15 which are provided to laminate in this order. When the OLED display panel is displaying an image, the OLED emitting zone 13 emits light towards the OLED substrate 15 side for display. That is, the transparent thin film 40 is disposed at the display surface side of the display panel 10.

An NFC antenna 70 is integrated in the display device, and the NFC antenna 70 is disposed at the display surface side of the display panel 10. The NFC antenna 70 is made of a transparent conductive material, such as ITO, graphene, or silver nanowire. In the present embodiment, the NFC antenna 70 is formed on the surfaces of the transparent thin film 40, so that the NFC antenna 70 is disposed on a side of the OLED substrate 15 that is far away from the OLED emitting zone 13. As the OLED emitting zone 13 emits light towards the OLED substrate 15 side for display, the NFC antenna 70 is located on a side of the display panel 10 being close to the display surface side.

Figure 5:
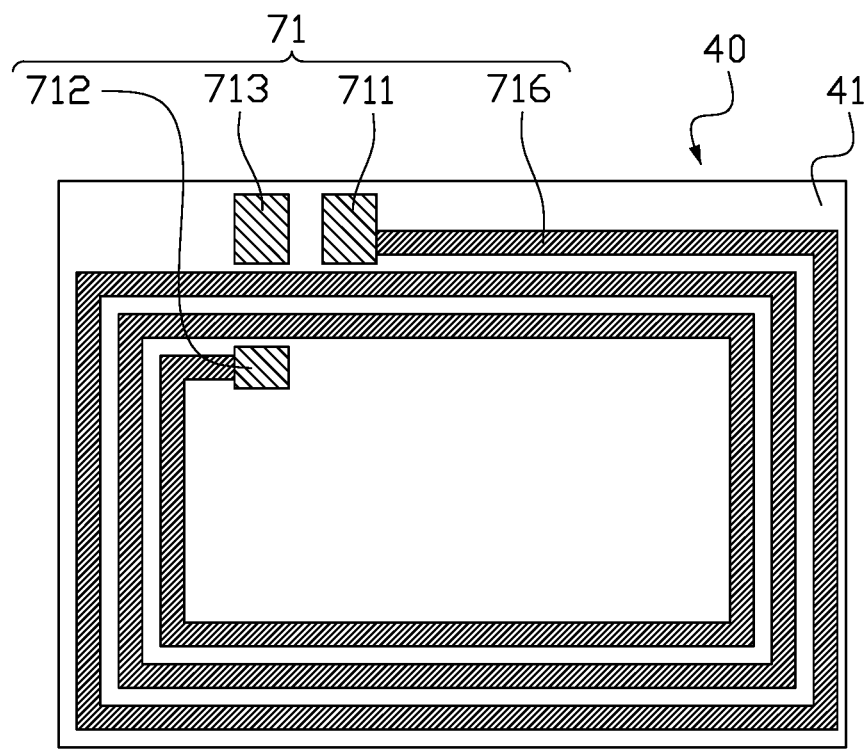
FIG. 5 is a plan schematic view of the first surface of the transparent thin film of FIG. 4.
Figure 6:
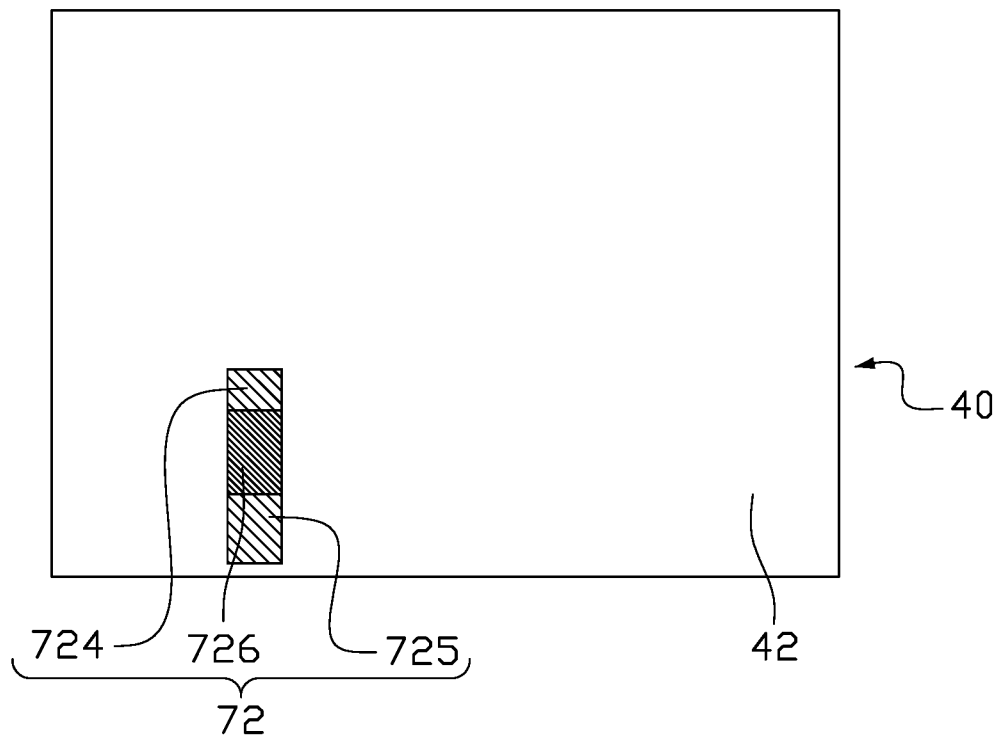
FIG. 6 is a plan schematic view of the second surface of the transparent thin film of FIG. 4.

FIG. 5 is a plan schematic view of the first surface of the transparent thin film of FIG. 4. FIG. 6 is a plan schematic view of the second surface of the transparent thin film of FIG. 4. Referring to FIGS. 5-6, in the present embodiment, the transparent thin film 40 has a first surface 41 and a second surface 42 being opposite to the first surface 41. The NFC antenna 70 includes a first antenna 71 and a second antenna 72. The first antenna 71 is formed on the first surface 41 of the transparent thin film 40 (the lower surface of the transparent thin film 40 in the present embodiment). The second antenna 72 is formed on the second surface 42 of the transparent thin film 40 (the upper surface of the transparent thin film 40 in the present embodiment). The first antenna 71 and the second antenna 72 are made of conductive materials having high transmittance and low resistance, such as ITO, graphene, or silver nanowire.

More specifically, the first antenna 71 is formed on the first surface 41 of the transparent thin film 40. The first antenna 71 includes a first engaging pad 711, a second engaging pad 712, a third engaging pad 713, and a wiring 716 connected between the first engaging pad 711 and the second engaging pad 712, wherein the first engaging pad 611 and the third engaging pad 713 are located at the edge of the transparent thin film 40. The second antenna 72 is formed on the second surface 42 of the transparent thin film 40. The second antenna 72 includes a fourth engaging pad 724, a fifth engaging pad 725, and a lead 726 connected between the fourth engaging pad 724 and the fifth engaging pad 725, wherein the fifth engaging pad 725 is located at the edge of the transparent thin film 40. The fifth engaging pad 725 and the third engaging pad 713 are aligned with each other. The fourth engaging pad 724 and the second engaging pad 712 are aligned with each other. The transparent thin film 40 is provided with a first through hole (not shown) and a second through hole (not shown). The second engaging pad 712 and the fourth engaging pad 724 are electrically connected via the first through hole. The third engaging pad 713 and the fifth engaging pad 725 are electrically connected via the second through hole. The first engaging pad 711 and the third engaging pad 713 are mutually staggered and used for connecting to an external circuit after being bonded with an FPC or led out in other ways.

The touch sensing layer 30 is provided between the display panel 10 and the NFC antenna 70. The touch sensing layer 30 causes the display device having touch function. In the present embodiment, the pattern of the touch sensing layer 30 is made of a conductor of graphene or silver nanowire, preferably, graphene. Because the magnetic field of the NFC antenna 70 is easily disturbed by metals, if the pattern of the touch sensing layer 30 is made of graphene, the wave absorption property of graphene can ensure the intensity of NFC signals better, thus not disturbing to the NFC signals.

The shielding layer 20 is provided between the display panel 10 and the touch sensing layer 30. The shielding layer 20 is a thin film coated with ITO, graphene, or silver nanowire, mainly used for shielding display signals of the display panel 10 from disturbing to the touch sensing layer 30 disposed above the display panel 10. The shielding layer 20 can be reserved or removed according to actual situations.

Third Embodiment

Figure 7:
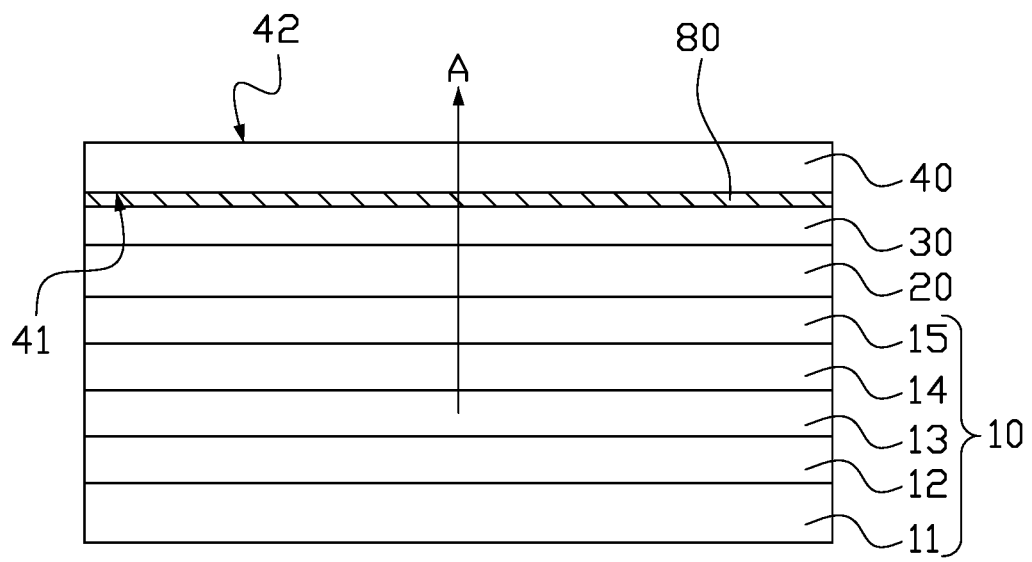
FIG. 7 is a structure schematic view of a display device according to a third embodiment of the present disclosure.

FIG. 7 is a structure schematic view of a display device according to a third embodiment of the present disclosure. Referring to FIG. 7, the display device includes a display panel 10, a shielding layer 20, a touch sensing layer 30 and a transparent thin film 40. In the present embodiment, the display panel 10, the shielding layer 20, the touch sensing layer 30 and the transparent thin film 40 are sequentially laminated. That is, the shielding layer 20 is disposed on the display panel 10, the touch sensing layer 30 is disposed on the shielding layer 20, and the transparent thin film 40 is disposed on the touch sensing layer 30. Each structural layer may be affixed to each other by optical clear adhesive (OCA).

The display panel 10 may be, for example, an OLED display panel, an E-ink display panel, or an LCD display panel. In the present embodiment, the display panel 10 is an OLED display panel and includes an OLED package cover 11, an OLED first electrode 12, an OLED emitting zone 13, an OLED second electrode 14 and an OLED substrate 15 which are provided to laminate in this order. When the OLED display panel is displaying an image, the OLED emitting zone 13 emits light towards the OLED substrate 15 side for display. That is, the transparent thin film 40 is disposed at the display surface side of the display panel 10.

An NFC antenna 80 is integrated in the display device, and the NFC antenna 80 is disposed at the display surface side of the display panel 10. The NFC antenna 80 is made of a transparent conductive material, such as ITO, graphene, or silver nanowire. In the present embodiment, the NFC antenna 80 is formed on a surface of the transparent thin film 40, so that the NFC antenna 80 is disposed on a side of the OLED substrate 15 that is far away from the OLED emitting zone 13. As the OLED emitting zone 13 emits light towards the OLED substrate 15 side for display, the NFC antenna 80 is located on a side of the display panel 10 being close to the display surface side.

Figure 8:
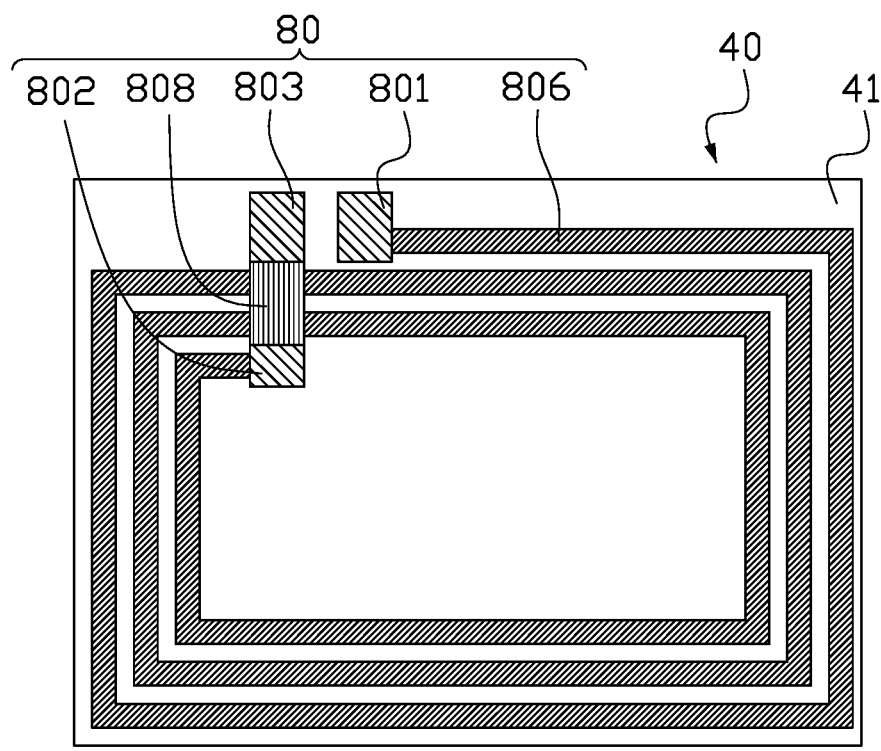
FIG. 8 is a plan schematic view of the transparent thin film of FIG. 7.

FIG. 8 is a plan schematic view of the transparent thin film of FIG. 7. Referring to FIGS. 7-8, the transparent thin film 40 has a first surface 41 and a second surface 42 being opposite to the first surface 41. In the present embodiment, the NFC antenna 80 is formed on the first surface 41 of the transparent thin film 40 (the lower surface of the transparent thin film 40 in the present embodiment). The NFC antenna 80 is made of a conductive material having high transmittance and low resistance, such as ITO, graphene, or silver nanowire.

More specifically, the NFC antenna 80 is formed on the first surface 41 of the transparent thin film 40. The NFC antenna 80 includes a first engaging pad 801, a second engaging pad 802, a third engaging pad 803, a wiring 806 connected between the first engaging pad 801 and the second engaging pad 802, and a transparent insulated wire 808, wherein the first engaging pad 801 and the third engaging pad 803 are located at the edge of the transparent thin film 40. The second engaging pad 802 at the inner side of the transparent thin film 40 is connected to the third engaging pad 803 at the outer side thereof via the transparent insulated wire 808, so that the second engaging pad 802 and the third engaging pad 803 are electrically connected, but the transparent insulated wire 808 is insulated from the wiring 806. The first engaging pad 801 and the third engaging pad 803 are mutually staggered and used for connecting to an external circuit after being bonded with an FPC or led out in other manners. In other embodiments, the NFC antenna 80 may also be formed on the second surface 42 of the transparent thin film 40.

Fourth Embodiment

Figure 9:
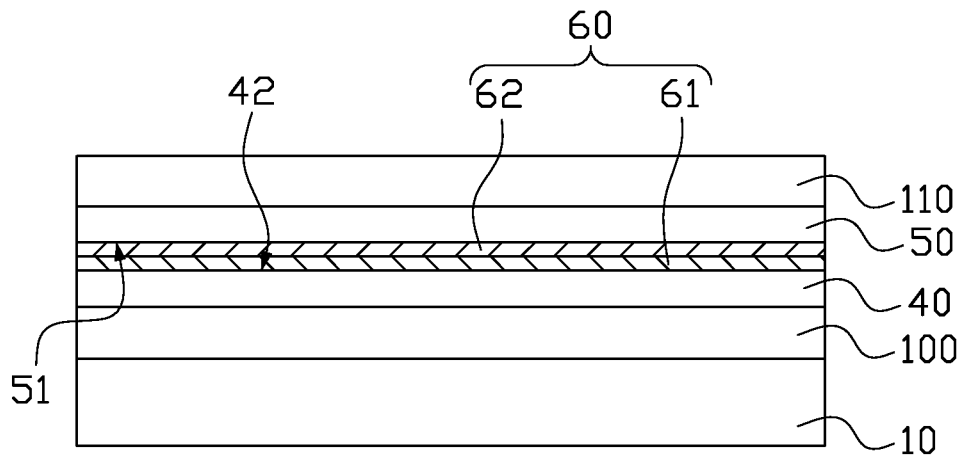
FIG. 9 is a structure schematic view of a display device according to a fourth embodiment of the present disclosure.

FIG. 9 is a structure schematic view of a display device according to a fourth embodiment of the present disclosure. Referring to FIG. 9, the display device includes a display panel 10, an isolating layer 100, a first transparent thin film 40, a second transparent thin film 50 and a cover glass 110. In the present embodiment, the display panel 10, the isolating layer 100, the first transparent thin film 40, the second transparent thin film 50 and the cover glass 110 are sequentially laminated. That is, the isolating layer 100 is disposed on the display panel 10, the first transparent thin film 40 is disposed on the isolating layer 100, the second transparent thin film 50 is disposed on the first transparent thin film 40, and the cover glass 110 is disposed on the second transparent thin film 50. Each structural layer may be affixed to each other by optical clear adhesive (OCA).

The display panel 10 may be, for example, an OLED display panel, an E-ink display panel, or an LCD display panel. In the present embodiment, the display panel 10 is, for example, an OLED display panel, and its structure can refer to the above first to third embodiments and is omitted herein for clarity. The first transparent thin film 40 and the second transparent thin film 50 are disposed at the display surface side of the display panel 10.

An NFC antenna 60 is integrated in the display device, and the NFC antenna 60 is disposed at the display surface side of the display panel 10. The NFC antenna 60 is made of a transparent conductive material, such as ITO, graphene, or silver nanowire. In the present embodiment, the NFC antenna 60 is formed between the first transparent thin film 40 and the second transparent thin film 50, so that the NFC antenna 60 is located on a side of the display panel 10 being close to the display surface side.

As shown in the above first embodiment, the NFC antenna 60 is formed of a transparent, low resistance material, such as ITO, graphene, or silver nanowire, coated on a single surface of the first transparent thin film 40 and the second transparent thin film 50. A first antenna 61 is formed on an upper surface 42 of the first transparent thin film 40, and a second antenna 62 is formed on a lower surface 51 of the second transparent thin film 50. The both transparent thin films 40, 50 are oppositely affixed together by the two surfaces 42, 51 having the antennas, to form the NFC antenna 60. The detailed structures about the first antenna 61 and the second antenna 62 can refer to the above first embodiment and are omitted herein for clarity.

Fifth Embodiment

Figure 10:
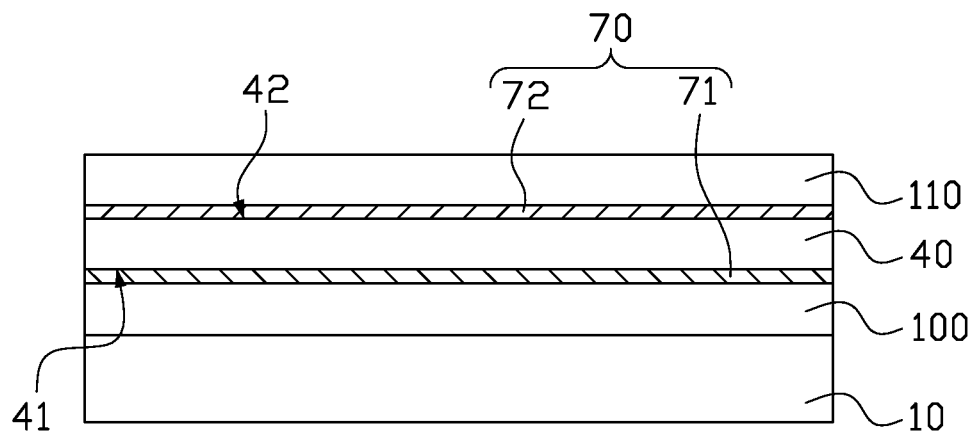
FIG. 10 is a structure schematic view of a display device according to a fifth embodiment of the present disclosure.

FIG. 10 is a structure schematic view of a display device according to a fifth embodiment of the present disclosure. Referring to FIG. 10, the display device includes a display panel 10, an isolating layer 100, a transparent thin film 40 and a cover glass 110. In the present embodiment, the display panel 10, the isolating layer 100, the transparent thin film 40 and the cover glass 110 are sequentially laminated. That is, the isolating layer 100 is disposed on the display panel 10, the transparent thin film 40 is disposed on the isolating layer 100, and the cover glass 110 covers on the transparent thin film 40. Each structural layer may be affixed to each other by optical clear adhesive (OCA). The transparent thin film 40 is disposed at the display surface side of the display panel 10.

An NFC antenna 70 is integrated in the display device, and the NFC antenna 70 is disposed at the display surface side of the display panel 10. The NFC antenna 70 is made of a transparent conductive material, such as ITO, graphene, or silver nanowire. In the present embodiment, the NFC antenna 70 is formed on the surfaces of the transparent thin film 40, so that the NFC antenna 70 is located on a side of the display panel 10 being close to the display surface side.

As shown in the above second embodiment, the NFC antenna 70 is formed on the transparent thin film 40 by a transparent, low resistance material, such as ITO, graphene, or silver nanowire. A first antenna 71 is formed on the first surface 41 of the transparent thin film 40 (the lower surface of the transparent thin film 40 in the present embodiment), and a second antenna 72 is formed on the opposite second surface 42 of the transparent thin film 40 (the upper surface of the transparent thin film 40 in the present embodiment). The first antenna 71 on the first surface 41 and the second antenna 72 on the second surface 42 are electrically connected together to form the NFC antenna 70. The detailed structures about the first antenna 71 and the second antenna 72 can refer to the above second embodiment and are omitted herein for clarity.

Sixth Embodiment

Figure 11:
FIG. 11 is a structure schematic view of a display device according to a sixth embodiment of the present disclosure.

FIG. 11 is a structure schematic view of a display device according to a sixth embodiment of the present disclosure. Referring to FIG. 11, the display device includes a display panel 10, an isolating layer 100, a transparent thin film 40 and a cover glass 110. In the present embodiment, the display panel 10, the isolating layer 100, the transparent thin film 40 and the cover glass 110 are sequentially laminated. That is, the isolating layer 100 is disposed on the display panel 10, the transparent thin film 40 is disposed on the isolating layer 100, and the cover glass 110 covers on the transparent thin film 40. Each structural layer may be affixed to each other by optical clear adhesive (OCA). The transparent thin film 40 is disposed at the display surface side of the display panel 10.

An NFC antenna 80 is integrated in the display device, and the NFC antenna 80 is disposed at the display surface side of the display panel 10. The NFC antenna 80 is made of a transparent conductive material, such as ITO, graphene, or silver nanowire. In the present embodiment, the NFC antenna 80 is formed on a surface of the transparent thin film 40, so that the NFC antenna 80 is located on a side of the display panel 10 being close to the display surface side.

As shown in the above third embodiment, the NFC antenna 80 is formed on the transparent thin film 40 by a transparent, low resistance material, such as ITO, graphene, or silver nanowire. The NFC antenna 80 is formed on the first surface 41 of the transparent thin film 40 (i.e., the lower surface of the transparent thin film 40). The detailed structure about the NFC antenna 80 can refer to the above third embodiment and is omitted herein for clarity.

It can be understood that, in other embodiments, the NFC antenna 80 may also be formed on the second surface 42 of the transparent thin film 40 (i.e., the upper surface of the transparent thin film 40).

Seventh Embodiment

Figure 12:
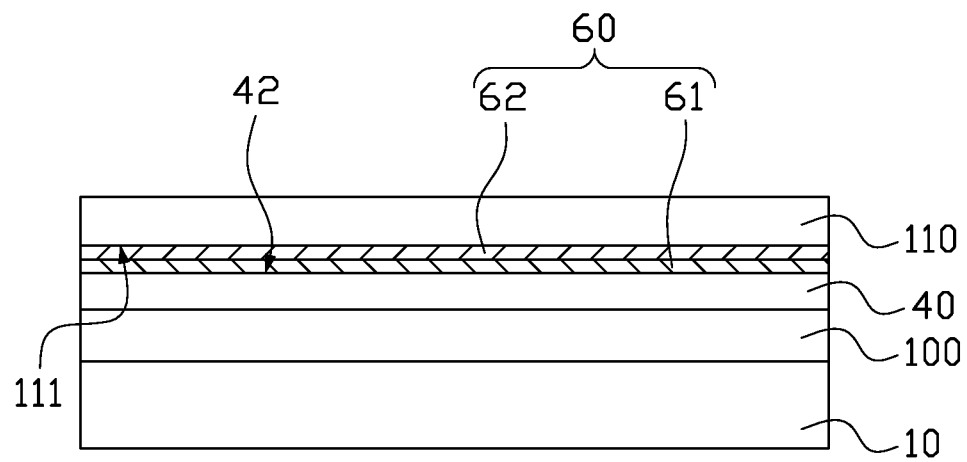
FIG. 12 is a structure schematic view of a display device according to a seventh embodiment of the present disclosure.

FIG. 12 is a structure schematic view of a display device according to a seventh embodiment of the present disclosure. Referring to FIG. 12, the display device includes a display panel 10, an isolating layer 100, a transparent thin film 40 and a cover glass 110. In the present embodiment, the display panel 10, the isolating layer 100, the transparent thin film 40 and the cover glass 110 are sequentially laminated. That is, the isolating layer 100 is disposed on the display panel 10, the transparent thin film 40 is disposed on the isolating layer 100, and the cover glass 110 covers on the transparent thin film 40. Each structural layer may be affixed to each other by optical clear adhesive (OCA). The transparent thin film 40 is disposed at the display surface side of the display panel 10.

An NFC antenna 60 is integrated in the display device, and the NFC antenna 60 is disposed at the display surface side of the display panel 10. The NFC antenna 60 is made of a transparent conductive material, such as ITO, graphene, or silver nanowire. In the present embodiment, the NFC antenna 60 is formed between the transparent thin film 40 and the cover glass 110, so that the NFC antenna 60 is located on a side of the display panel 10 being close to the display surface side.

In the present embodiment, the NFC antenna 60 includes a first antenna 61 and a second antenna 62. The first antenna 61 is formed on a surface 42 of the transparent thin film 40 (the upper surface of the transparent thin film 40 in the present embodiment). The second antenna 62 is formed on a surface 111 of the cover glass 110 (the lower surface of the cover glass 110 in the present embodiment). The transparent thin film 40 and the cover glass 110 are oppositely affixed together by the two surfaces 42, 111 having the antennas, to form the NFC antenna 60. The detailed structures about the first antenna 61 and the second antenna 62 can refer to the above first embodiment and are omitted herein for clarity.

That is, the above seventh embodiment (FIG. 12) differs from the above fourth embodiment (FIG. 9) in that, in the above fourth embodiment, the cover glass 110 acts only as a protecting cover, the NFC antenna 60 is formed on the additional two transparent thin films 40, 50. However, in the above seventh embodiment, the cover glass 110 not only acts as a protecting cover, but also there is further provided on the surface 111 of the cover glass 110 with a portion of the NFC antenna (i.e., the second antenna 62). Thus, the seventh embodiment can reduce one transparent thin film compared with the fourth embodiment, which is conducive to reduce the cost and the product thickness.

In the above fourth embodiment to the above seventh embodiment, the touch sensing layer 30 is not provided inside the display device. Therefore, the display device is suitable for the occasions not requiring touch function.

In the above fourth embodiment to the above seventh embodiment, the isolating layer 100 is provided between the display panel 10 and the NFC antennas 60, 70, 80. The isolating layer 100 is a transparent thin film coated with a transparent wave absorption material, such as graphene, for isolating display signals of the display panel 10 from disturbing to the NFC signals and weakening the signals. If the isolating layer 100 is coated with of graphene, the wave absorption property of graphene can ensure the intensity of the NFC signals better, thus not disturbing to the NFC signals.

In the above fourth embodiment to the above seventh embodiment, the cover glass 110 covers on sides of the NFC antennas 60, 70, 80 far away from the display panel 10 side, for protecting purpose. Further, in the above seventh embodiment, the cover glass 110 also plays a role of providing a portion of the NFC antenna.

Eighth Embodiment to Eleventh Embodiment

Figure 13:
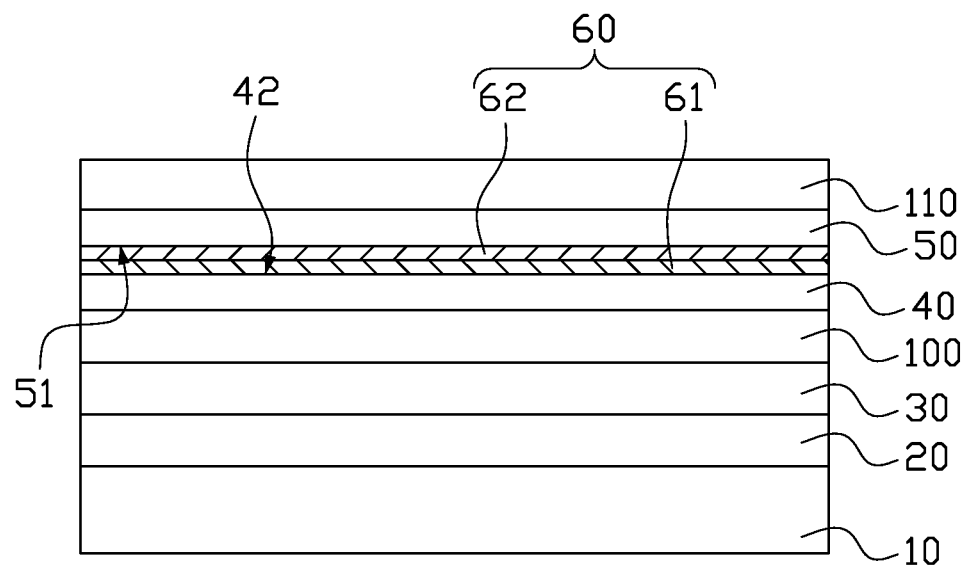
FIG. 13 is a structure schematic view of a display device according to an eighth embodiment of the present disclosure.
Figure 14:
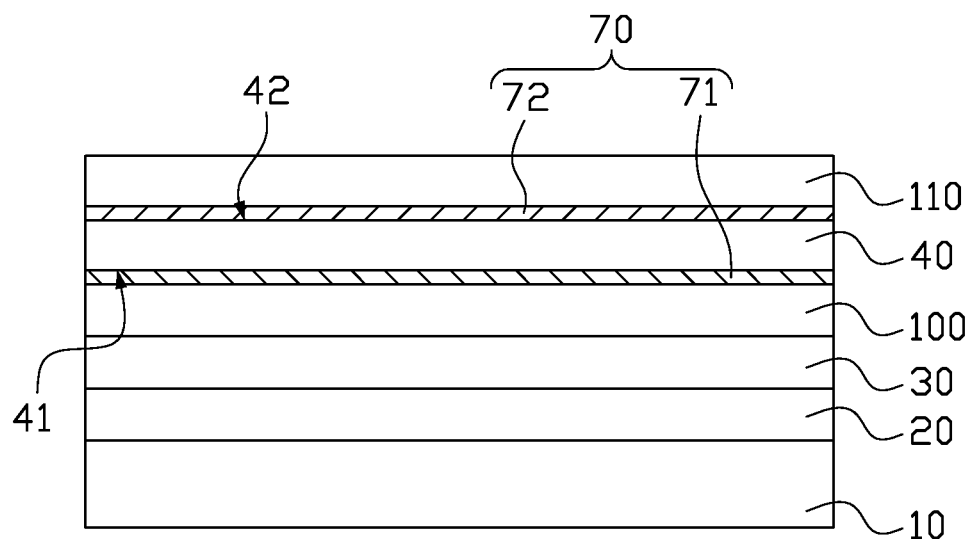
FIG. 14 is a structure schematic view of a display device according to a ninth embodiment of the present disclosure.
Figure 15:
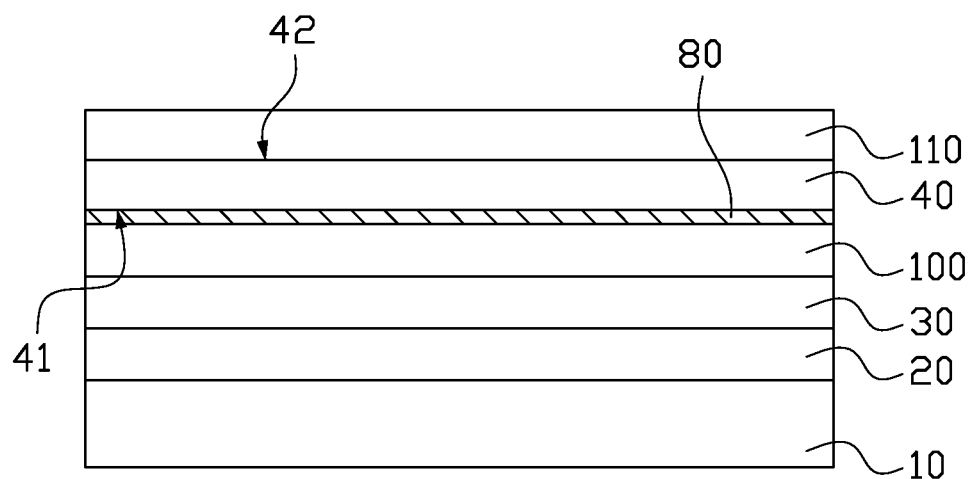
FIG. 15 is a structure schematic view of a display device according to a tenth embodiment of the present disclosure.
Figure 16:
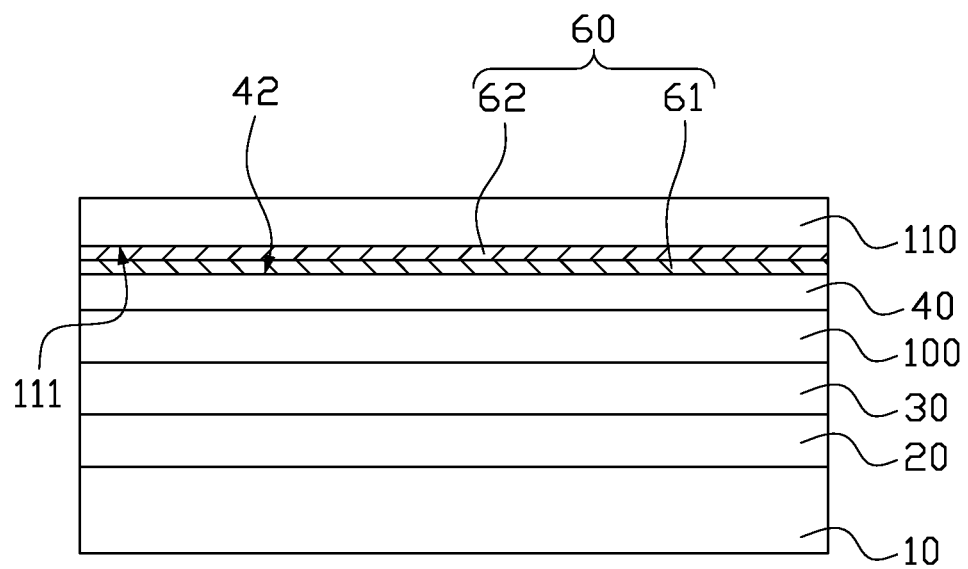
FIG. 16 is a structure schematic view of a display device according to an eleventh embodiment of the present disclosure.

FIG. 13 is a structure schematic view of a display device according to an eighth embodiment of the present disclosure. FIG. 14 is a structure schematic view of a display device according to a ninth embodiment of the present disclosure. FIG. 15 is a structure schematic view of a display device according to a tenth embodiment of the present disclosure. FIG. 16 is a structure schematic view of a display device according to an eleventh embodiment of the present disclosure. Referring to FIGS. 13-16, the display devices in the eighth to eleventh embodiments respectively correspond to, and have substantially the same structure as, those of the above fourth to seventh embodiments, the difference between which is just in that the display devices in the eighth to eleventh embodiments further include a shielding layer 20 and a touch sensing layer 30, wherein the shielding layer 20 is disposed on the display panel 10, the touch sensing layer 30 is disposed on the shielding layer 20, and the isolating layer 100 is disposed on the touch sensing layer 30.

In the above eighth embodiment to the above eleventh embodiment, the touch sensing layer 30 is provided between the display panel 10 and the NFC antennas 60, 70, 80. The touch sensing layer 30 causes the display device having a touch function. The pattern of the touch sensing layer 30 may be made of a conductive material of ITO, graphene or silver nanowire.

The shielding layer 20 is provided between the display panel 10 and the touch sensing layer 30. The shielding layer 20 is a thin film coated with a material such as ITO, graphene, or silver nanowire, and may shield display signals in the display panel 10 from disturbing to the touch sensing layer 30 disposed above the display panel 10. The shielding layer 20 can be reserved or removed according to actual situations.

The isolating layer 100 is provided between the touch sensing layer 30 and the NFC antennas 60, 70, 80. The isolating layer 100 preferably is a thin film coated with a transparent wave absorption material such as graphene, and mainly used for isolating sensing signals of the touch sensing layer 30 from disturbing to the NFC signals and weakening the signals. As the isolating layer 100 coated with graphene is arranged between the touch sensing layer 30 and the NFC antennas 60, 70, 80, the pattern of the touch sensing layer 30 can be made of metal oxide, such as ITO. The magnetic fields of the NFC antennas 60, 70, 80 is easily disturbed by metals, however, the isolating layer 100 can ensure the magnetic fields of the NFC antennas from being disturbed by metal conductors of the touch sensing layer 30.

The isolating layer 100 can be reserved or removed according to actual situations. If the isolating layer 100 is removed, the pattern of the touch sensing layer 30 is preferably made of a conductor of graphene, because the wave absorption property of graphene can ensure the intensity of the NFC signals better, thus not disturbing to the NFC signals.

Twelfth Embodiment

Figure 17:
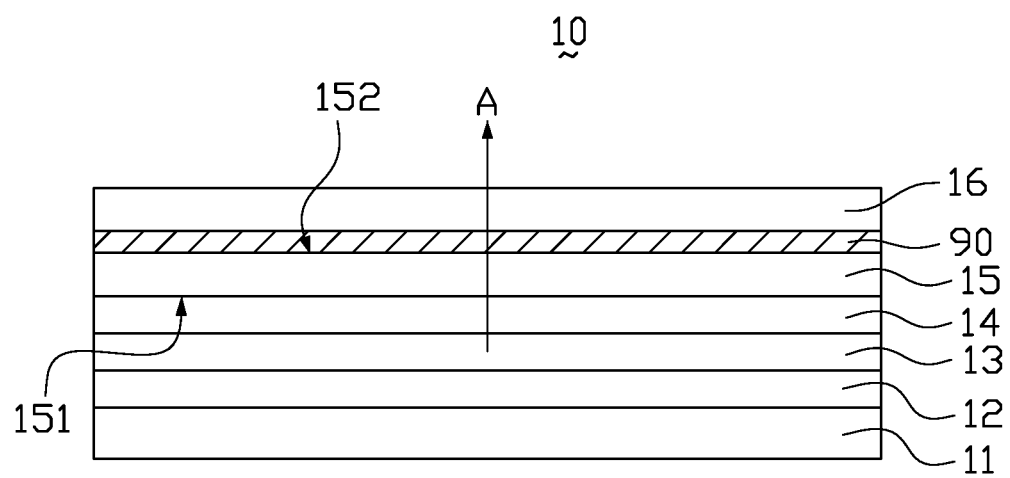
FIG. 17 is a structure schematic view of a display device according to a twelfth embodiment of the present disclosure.

FIG. 17 is a structure schematic view of a display device according to a twelfth embodiment of the present disclosure. Referring to FIG. 17, the display device includes an OLED display panel 10. The OLED display panel 10 includes an OLED package cover 11, an OLED first electrode 12, an OLED emitting zone 13, an OLED second electrode 14, an OLED substrate 15 and an insulating protection film 16 which are provided to laminate in this order. In detail, the OLED first electrode 12 is disposed on the OLED package cover 11, the OLED emitting zone 13 is disposed on the OLED first electrode 12, the OLED second electrode 14 is disposed on the OLED emitting zone 13, the OLED substrate 15 is disposed on the OLED second electrode 14, and the insulating protection film 16 is disposed on the OLED substrate 15. The OLED substrate 15 has a first surface 151 facing towards the OLED emitting zone 13 and a second surface 152 being far away from the OLED emitting zone 13.

In the OLED display panel 10, the OLED package cover 11 is used for package, which usually consists of a package cover and a desiccant or a package film and a desiccant, to prevent water and oxygen from entering into the OLED emitting zone 13. The OLED first electrode 12 is usually an opaque metal (such as aluminum, silver, or magnesium) electrode, and is provided over the whole surface. The OLED emitting zone 13 includes, for example, an electron injection layer, an electron transport layer, a light emitting layer, a hole injection layer, and a hole transport layer. The OLED second electrode 14 is usually formed of a transparent conductive material, such as ITO. The OLED substrate 15 is usually a transparent material, such as glass or flexible thin film. The OLED second electrode 14 may be formed on the first surface 151 side of the OLED substrate 15 by, for example, etching or printing. The OLED substrate 14 specifically includes OLED pixels and leads, wherein the leas are connected to an OLED driver IC (not shown). The OLED emitting zone 13 emits light towards the OLED substrate 15 side for display (as indicated by arrow A in the drawing). That is, the picture of the OLED display panel 10 is displayed on the OLED substrate 15 side.

An NFC antenna 90 is integrated in the OLED display device 10, and the NFC antenna 90 is formed on the second surface 152 of the OLED substrate 15. The insulating protection film 16 covers on the NFC antenna 90. The NFC antenna 90 is made of a transparent conductive material, such as ITO, graphene, or silver nanowire. As the picture of the OLED display panel 10 is displayed on the OLED substrate 15 side, the NFC antenna 90 integrated in the OLED display device 10 is disposed at the display surface side of the OLED display panel 10. In the present embodiment, the NFC antenna 90 is directly formed on the second surface 152 of the OLED substrate 15, i.e., no intermediate layer is interposed between the NFC antenna 90 and the second surface 152 of the OLED substrate 15. The NFC antenna 90 may be directly formed on the second surface 152 of the OLED substrate 15 by, for example, etching or printing.

Figure 18:
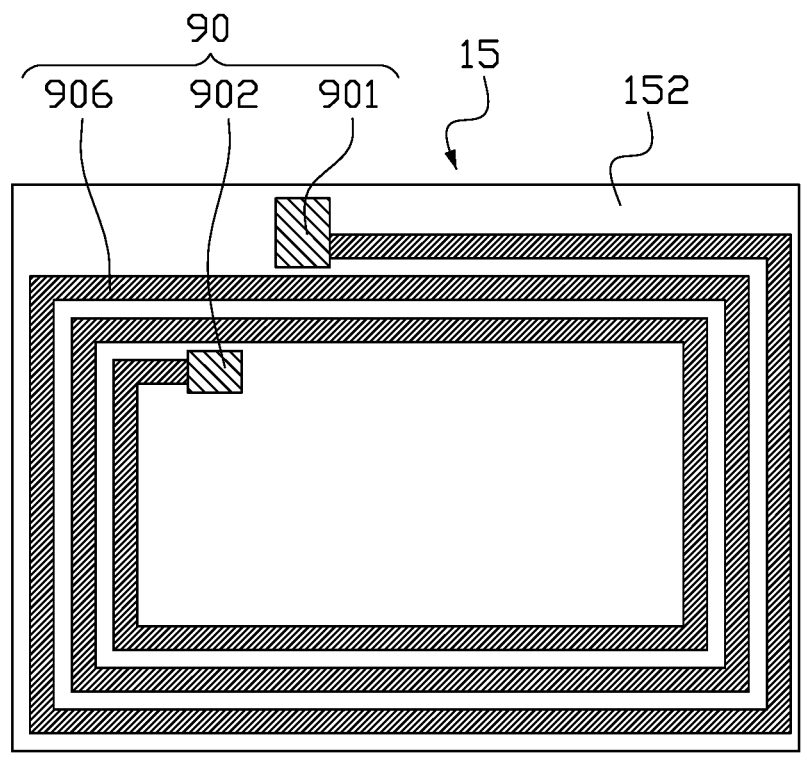
FIG. 18 is a plan schematic view of an example of the OLED substrate of FIG. 17.

FIG. 18 is a plan schematic view of an example of the OLED substrate of FIG. 17. Referring to FIG. 18, in the present example, the NFC antenna 90 is directly formed on the second surface 152 of the OLED substrate 15. The NFC antenna 90 includes a first engaging pad 901, a second engaging pad 902, and a wiring 906 connected between the first engaging pad 901 and the second engaging pad 902. The NFC antenna 90 may be directly formed on the second surface 152 of the OLED substrate 15 by, for example, etching or printing. The first engaging pad 901 and the second engaging pad 902 are used for connecting to an external circuit after being bonded with an FPC or led out in other manners.

Figure 19:
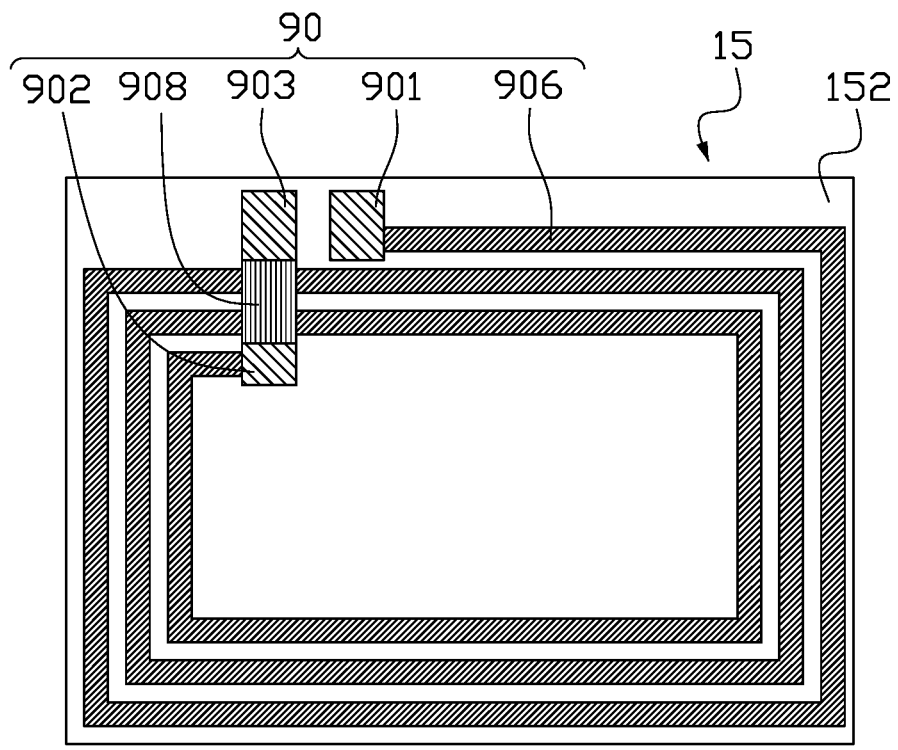
FIG. 19 is a plan schematic view of another example of the OLED substrate of FIG. 17.

FIG. 19 is a plan schematic view of another example of the OLED substrate of FIG. 17. Referring to FIG. 19, in the present example, the NFC antenna 90 is directly formed on the second surface 152 of the OLED substrate 15. The NFC antenna 90 includes a first engaging pad 901, a second engaging pad 902, a third engaging pad 903, a wiring 906 connected between the first engaging pad 901 and the second engaging pad 902, and a transparent insulated wire 908, wherein the first engaging pad 901 and the third engaging pad 903 are located at the edge of the OLED substrate 15. The second engaging pad 902 on the inner side of the OLED substrate 15 is connected to the third engaging pad 903 on the outer side via the transparent insulated wire 908, so that the second engaging pad 902 and the third engaging pad 903 are electrically connected, but the transparent insulated wire 908 is insulated from the wiring 906. The first engaging pad 901 and the third engaging pad 903 are mutually staggered and used for connecting to an external circuit after being bonded with an FPC or led out in other manners. The NFC antenna 90 may be directly formed on the second surface 152 of the OLED substrate 15 by, for example, etching or printing.

As the NFC antenna 90 is made of a transparent conductive material, such as ITO, graphene, or silver nanowire, the NFC antenna 90 can be arranged randomly according to actual requirements, it is not limited to be arranged in the non-display area. As such, the NFC antenna 90 can be disposed in the display area of the OLED display panel 10 without affecting the display, which is beneficial to a design of narrow frame for the OLED display panel 10.

After the NFC antenna 90 is directly formed on the second surface 152 of the OLED substrate 15, then the NFC antenna 90 is covered by the insulating protection film 16. The insulating protection film 16 covers on the NFC antenna 90 to protect and insulate the NFC antenna 90. The insulating protection film 16 can be made of glass, acrylic, flexible thin film and other materials. In addition, the insulating protection film 16 can also be replaced by a circular polarizer or a transparent optical clear adhesive (OCA) or other components or materials.

Thirteenth Embodiment

Figure 20:
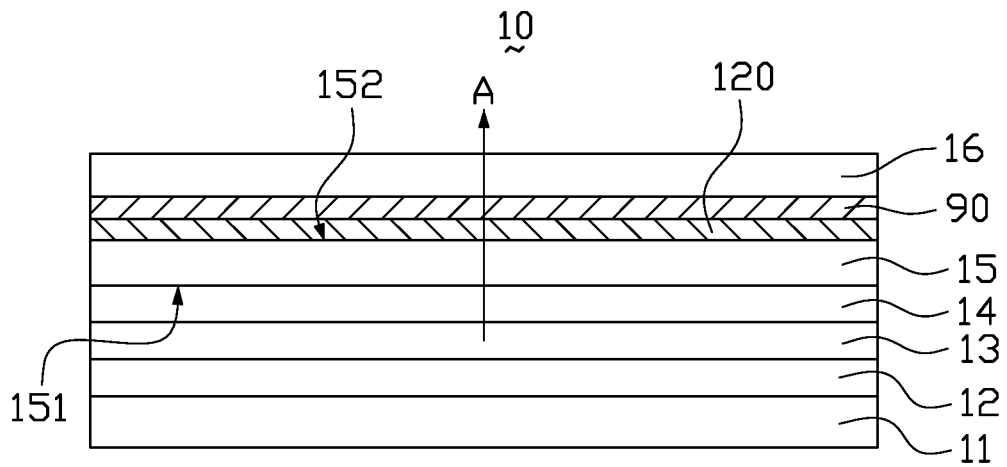
FIG. 20 is a structure schematic view of a display device according to a thirteenth embodiment of the present disclosure.

FIG. 20 is a structure schematic view of a display device according to a thirteenth embodiment of the present disclosure. Referring to FIG. 20, the present embodiment differs from the above twelfth embodiment in that, a transparent wave absorption material layer 120 is further provided between the NFC antenna 90 and the second surface 152 of the OLED substrate 15, for preventing the NFC signals from being disturbed by the OLED display. That is, the transparent wave absorption material layer 120 is firstly provided on the second surface 152 of the OLED substrate 15, and a layer of the NFC antenna 90 is thereafter provided on the transparent wave absorption material layer 120. The transparent wave absorption material layer 120 is made of, for example, graphene, mainly used for isolating display signals below from disturbing to the NFC signals above and weakening the signals. The wave absorption property of graphene can ensure the intensity of the NFC signals, thus not disturbing to the NFC signals. The structure about the NFC antenna 90 can refer to FIG. 18 or FIG. 19, and is omitted herein for clarity.

Fourteenth Embodiment

Figure 21:
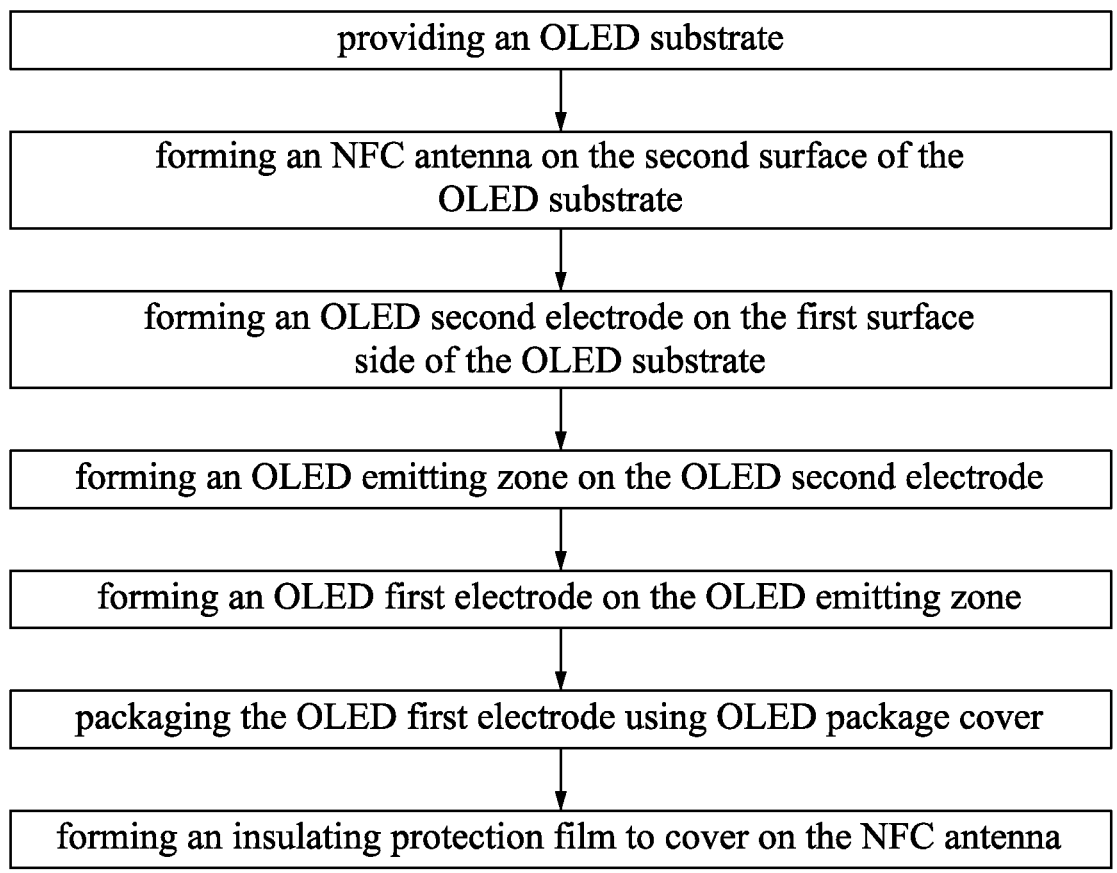
FIG. 21 is a flow chart of a producing method for a display device according to a fourteenth embodiment of the present disclosure.

FIG. 21 is a flow chart of a producing method for a display device according to a fourteenth embodiment of the present disclosure, for producing the OLED display panel 10 shown in FIG. 17 or FIG. 20. Specifically, the producing method for the OLED display panel 10 includes the following steps:

providing an OLED substrate 15, wherein the OLED substrate 15 has a first surface 151 and a second surface 152 which are opposite to each other, the OLED substrate 15 is usually made of a transparent material, such as glass or flexible thin film;

forming an NFC antenna 90 on the second surface 152 of the OLED substrate 15, wherein the NFC antenna 90 may be formed on the second surface 152 of the OLED substrate 15 by, for example, etching or printing, and the NFC antenna 90 is made of a transparent conductive material, such as ITO, graphene, or silver nanowire;

forming an OLED second electrode 14 on the first surface 151 side of the OLED substrate 15, wherein the OLED second electrode 14 specifically includes OLED pixels and leads;

forming an OLED emitting zone 13 on the OLED second electrode 14, wherein the OLED emitting zone 13 includes structural layers, such as an electron injection layer, an electron transport layer, an emitting layer, a hole injection layer, and a hole transport layer;

forming an OLED first electrode 12 on the OLED emitting zone 13, wherein the OLED first electrode 12 is usually an opaque metal (such as aluminum, silver, or magnesium) electrode, and wholly covers on the OLED emitting zone 13;

packaging the OLED first electrode 12 using an OLED package cover 11, wherein the OLED package cover 11 is used for package, which usually consists of a package cover and a desiccant or a package film and a desiccant, to avoid water and oxygen from entering into the OLED emitting zone 13;

forming an insulating protection film 16 to cover on the NFC antenna 90, wherein the OLED emitting zone 13 emits light towards the OLED substrate 15 side for display, so that the NFC antenna 90 is disposed on the display surface side of the OLED display panel 10, and the insulating protection film 16 is used for protecting and insulating the NFC antenna 90.

In addition, the producing method further includes forming a transparent wave absorption material layer 120 between the NFC antenna 90 and the second surface 152 of the OLED substrate 15. The transparent wave absorption material layer 120 is firstly formed on the second surface 152 of the OLED substrate 15, the NFC antenna 90 is thereafter formed on the transparent electromagnet absorption material layer 120. The transparent wave absorption material layer 120 is made of, for example, graphene, mainly used for isolating display signals below from disturbing to the NFC signals above and weakening the signals. The wave absorption property of graphene can ensure the intensity of NFC signals, thus not disturbing to the NFC signals.

As described above, the above embodiments provide a display device integrated with a display panel and an NFC antenna. By integrating the NFC antenna in the display device may reduce the number of components, reduce the thickness of the module, simplify the producing process and lower the production cost. Further, by disposing the NFC antenna on the surface of a small-sized electronic device (i.e., the display surface), for the devices that need NFC communication from the surface of the device, the communication distance of NFC signals is shortened, and the sensitivity and reliability of the NFC signals are higher. At the same time, the problem, that the NFC antenna is easily broken and misaligned which is caused by the assembly and disassembly of the battery and the housing, is solved.

The existing NFC antenna is made of silver, copper, or other conductors. When the coil of the NFC antenna is integrated with the display panel, the coil must be put outside the display area to avoid the NFC antenna from blocking the display area. At the same time, in order to ensure the space for the NFC antenna, the frame of the NFC antenna will be very large, thereby increasing the width of the frame of the non-display area of the module for sure. In the embodiments of the present disclosure, by using a transparent, low resistance material, such as ITO, graphene, or silver nanowire as the conductor of the NFC antenna, so that the NFC antenna can be put in the display area, without the worry of the NFC antenna extending into the display area to affect the display effect. The outer profile of the NFC antenna and its mounting position on the display panel can be freely chosen. It can realize a design of narrow frame for the module, to meet the design requirements of narrow frame for mobile phones, watches or other portable electronic devices. Therefore, it has a good market prospect in the application field of small-sized electronic devices, such as wearable devices.

When the existing NFC antenna is integrated in a touch panel, a ferrite layer is required to be added as an absorbing material, to ensure that the magnetic field of the NFC antenna is not disturbed by the surrounding metal conductors. In the embodiments of the present disclosure, the display device is made to have a touch function by arranging a touch sensing layer. The pattern of the touch sensing layer is preferably made of graphene having a stable performance, the wave absorption property of graphene determines the touch sensing layer to act as a wave absorption material for the NFC antenna, without the need of further providing a ferrite layer.

In the embodiments of the present disclosure, a shielding layer is provided between the display panel and the touch sensing layer. The shielding layer can shield the display signals in the display panel from disturbing to the touch sensing layer disposed above the display panel. An isolating layer is provided between the touch sensing layer and the NFC antenna. The isolating layer can ensure the touch sensing layer not to disturbing to the NFC signals. The cover glass provided on the outmost side can protect the NFC antenna.

The above description are preferred embodiments of the present disclosure only, and should not be deemed as limitations to the present disclosure. It is to be understood that, any modifications, equivalent replacements and improvements within the spirit and principle of the present disclosure, should be included within the scope of protection of the present disclosure.

INDUSTRIAL APPLICABILITY

In the display devices having an NFC communication function according to the embodiments of the present disclosure, by integrating the NFC antenna in the display device may reduce the number of components, reduce the thickness of the module, simplify the producing process and lower the production cost. Further, by disposing the NFC antenna on the display surface side of the display panel, the communication distance of NFC signals is shortened, and the sensitivity and reliability of the NFC signals are higher. At the same time, the conventional problem, that the NFC antenna is easily broken and misaligned which is caused by the assembly and disassembly of the battery and the housing, is solved, by using a transparent, low resistance material, such as ITO, graphene, or silver nanowire as the conductor of the NFC antenna, so that the NFC antenna can be put in the display area, it is conductive to a design of narrow frame for the module, to meet the design requirements of narrow frame for mobile phones, watches or other portable electronic devices. Therefore, it has a good market prospect in the application field of small-sized electronic devices, such as wearable devices.

What is claimed is:

1. A display device having an NFC (near field communication) communication function, comprising a display panel, wherein an NFC antenna is integrated in the display device, the NFC antenna is disposed on a display surface side of the display panel, and the NFC antenna is made of a transparent conductive material;
   wherein a touch sensing layer is provided between the display panel and the NFC antenna;
   wherein a shielding layer is provided between the display panel and the touch sensing layer; and
   wherein an isolating layer is provided between the touch sensing layer and the NFC antenna;
   wherein the shielding layer is a thin film coated with ITO, graphene, or silver nanowire, used for shielding display signals of the display panel from disturbing to the touch sensing layer;
   wherein the isolating layer is a thin film coated with a transparent wave absorption material, used for isolating sensing signals of the touch sensing layer from disturbing to the NFC signals and weakening the signals.

2. The display device having an NFC communication function of claim 1, wherein the NFC antenna is made of ITO, graphene, or silver nanowire.

3. The display device having an NFC communication function of claim 1, wherein a first transparent thin film and a second transparent thin film are provided on the display panel, the NFC antenna includes a first antenna and a second antenna, the first antenna is formed on a surface of the first transparent thin film, the second antenna is formed on a surface of the second transparent thin film, and the first transparent thin film and the second transparent thin film are oppositely affixed together by the two surfaces having the antennas.

4. The display device having an NFC communication function of claim 3, wherein the first antenna includes a first engaging pad, a second engaging pad, and a wiring connected between the first engaging pad and the second engaging pad, the second antenna includes a third engaging pad, a fourth engaging pad, and a lead connected between the third engaging pad and the fourth engaging pad, the second engaging pad and the fourth engaging pad are correspondingly affixed and electrically connected, and the first engaging pad and the third engaging pad are mutually staggered and used for connecting to an external circuit.

5. The display device having an NFC communication function of claim 1, wherein a transparent thin film is provided on the display panel, the transparent thin film has a first surface and a second surface being opposite to the first surface, the NFC antenna includes a first antenna and a second antenna, the first antenna is formed on the first surface of the transparent thin film, and the second antenna is formed on the second surface of the transparent thin film.

6. The display device having an NFC communication function of claim 5, wherein the first antenna includes a first engaging pad, a second engaging pad, a third engaging pad, and a wiring connected between the first engaging pad and the second engaging pad, the second antenna includes a fourth engaging pad, a fifth engaging pad, and a lead connected between the fourth engaging pad and the fifth engaging pad, the transparent thin film is defined with a first through hole and a second through hole, a position of the second engaging pad corresponds to a position of the fourth engaging pad, and the second engaging pad and the fourth engaging pad are electrically connected via the first through hole, a position of the third engaging pad corresponds to a position of the fifth engaging pad, and the third engaging pad and the fifth engaging pad are electrically connected via the second through hole, and the first engaging pad and the third engaging pad are mutually staggered and used for connecting to an external circuit.

7. The display device having an NFC communication function of claim 1, wherein a transparent thin film is provided on the display panel, the transparent thin film has a first surface and a second surface being opposite to the first surface, and the NFC antenna is formed on the first surface of the transparent thin film.

8. The display device having an NFC communication function of claim 7, wherein the NFC antenna includes a first engaging pad, a second engaging pad, a third engaging pad, a wiring connected between the first engaging pad and the second engaging pad, and a transparent insulated wire, the second engaging pad is electrically connected to the third engaging pad via the transparent insulated wire, and the first engaging pad and the third engaging pad are mutually staggered and used for connecting to an external circuit.

9. The display device having an NFC communication function of claim 1, wherein a transparent thin film and a cover glass are provided on the display panel, the cover glass covers on the transparent thin film, the NFC antenna includes a first antenna and a second antenna, the first antenna is formed on a surface of the transparent thin film, the second antenna is formed on a surface of the cover glass, and the transparent thin film and the cover glass are oppositely affixed together by the two surfaces having the antennas.

10. The display device having an NFC communication function of claim 9, wherein the first antenna includes a first engaging pad, a second engaging pad, and a wiring connected between the first engaging pad and the second engaging pad, the second antenna includes a third engaging pad, a fourth engaging pad, and a lead connected between the third engaging pad and the fourth engaging pad, the second engaging pad and the fourth engaging pad are correspondingly affixed and electrically connected, the first engaging pad and the third engaging pad are mutually staggered and used for connecting to an external circuit.

11. The display device having an NFC communication function of claim 1, wherein the display panel is an OLED display panel and includes an OLED package cover, an OLED first electrode, an OLED emitting zone, an OLED second electrode and an OLED substrate which are provided to laminate in this order, the OLED emitting zone emits light towards a side of the OLED substrate for display, the NFC antenna is disposed on a side of the OLED substrate that is far away from the OLED emitting zone.

12. The display device having an NFC communication function of claim 11, wherein the OLED substrate has a first surface facing towards the OLED emitting zone and a second surface being far away from the OLED emitting zone, the NFC antenna is formed on the second surface of the OLED substrate.

13. The display device having an NFC communication function of claim 12, wherein the NFC antenna is directly formed on the second surface of the OLED substrate.

14. The display device having an NFC communication function of claim 12, wherein a transparent wave absorption material layer is provided between the NFC antenna and the second surface of the OLED substrate, the transparent wave absorption material layer is firstly provided on the second surface of the OLED substrate, the NFC antenna is thereafter provided on the transparent wave absorption material layer.

15. The display device having an NFC communication function of claim 12, wherein the NFC antenna includes a first engaging pad, a second engaging pad, and a wiring connected between the first engaging pad and the second engaging pad.

16. The display device having an NFC communication function of claim 12, wherein the NFC antenna includes a first engaging pad, a second engaging pad, a third engaging pad, a wiring connected between the first engaging pad and the second engaging pad, and a transparent insulated wire, the second engaging pad is electrically connected to the third engaging pad via the transparent insulated wire, and the first engaging pad and the third engaging pad are mutually staggered and used for connecting to an external circuit.

17. The display device having an NFC communication function of claim 1, wherein the isolating layer is a thin film coated with graphene.

18. A display device having an NFC (near field communication) communication function, comprising a display panel, wherein an NFC antenna is integrated in the display device, the NFC antenna is disposed on a display surface side of the display panel, and the NFC antenna is made of a transparent conductive material;

wherein a transparent thin film is provided on the display panel, the transparent thin film has a first surface and a second surface being opposite to the first surface, the NFC antenna includes a first antenna and a second antenna, the first antenna is formed on the first surface of the transparent thin film, and the second antenna is formed on the second surface of the transparent thin film;

wherein the first antenna includes a first engaging pad, a second engaging pad, a third engaging pad, and a wiring connected between the first engaging pad and the second engaging pad, the second antenna includes a fourth engaging pad, a fifth engaging pad, and a lead connected between the fourth engaging pad and the fifth engaging pad, the transparent thin film is defined with a first through hole and a second through hole, a position of the second engaging pad corresponds to a position of the fourth engaging pad, and the second engaging pad and the fourth engaging pad are electrically connected via the first through hole, a position of the third engaging pad corresponds to a position of the fifth engaging pad, and the third engaging pad and the fifth engaging pad are electrically connected via the second through hole, and the first engaging pad and the third engaging pad are mutually staggered and used for connecting to an external circuit.

\* \* \* \* \*